US006623790B2

(12) United States Patent
Fernihough et al.

(10) Patent No.: US 6,623,790 B2
(45) Date of Patent: Sep. 23, 2003

(54) METHOD OF ADJUSTING THE SIZE OF COOLING HOLES OF A GAS TURBINE COMPONENT

(75) Inventors: John Fernihough, Ennetbaden (CH); Markus Oehl, Waldshut-Tiengen (DE)

(73) Assignee: Alstom (Switzerland) Ltd, Baden (CH)

( * ) Notice: Subject to any disclaimer, the term of this patent is extended or adjusted under 35 U.S.C. 154(b) by 0 days.

(21) Appl. No.: 09/867,625

(22) Filed: May 31, 2001

(65) Prior Publication Data

US 2001/0048972 A1 Dec. 6, 2001

(30) Foreign Application Priority Data

May 31, 2000 (EP) .............................. 00111617

(51) Int. Cl.⁷ .............................. C23C 16/08
(52) U.S. Cl. .............. 427/140; 427/142; 427/237; 427/239; 427/248.1; 427/250; 427/253; 427/282
(58) Field of Search ................. 427/237, 239, 427/248.1, 250, 253, 140, 142, 282; 415/115, 116

(56) References Cited

U.S. PATENT DOCUMENTS

| | | | | |
|---|---|---|---|---|
| 3,528,861 A | * | 9/1970 | Elam et al. | 148/534 |
| 4,152,223 A | | 5/1979 | Wallace et al. | |
| 4,188,237 A | | 2/1980 | Chasteen | |
| 4,585,481 A | | 4/1986 | Gupta et al. | |
| 4,743,462 A | | 5/1988 | Radzavich et al. | |
| 5,071,486 A | | 12/1991 | Chasteen | |
| 5,368,888 A | | 11/1994 | Rigney | |
| 5,451,142 A | | 9/1995 | Cetel et al. | |
| 5,728,227 A | | 3/1998 | Reverman | |
| 5,800,695 A | | 9/1998 | Kang et al. | |
| 5,941,686 A | * | 8/1999 | Gupta et al. | 415/115 |
| 6,042,879 A | | 3/2000 | Draghi et al. | |
| 6,203,847 B1 | * | 3/2001 | Conner et al. | 427/142 |
| 6,332,926 B1 | * | 12/2001 | Pfaendtner et al. | 118/721 |
| 6,339,879 B1 | * | 1/2002 | Wheat et al. | 29/889.721 |
| 6,416,589 B1 | | 7/2002 | Lipkin et al. | |

FOREIGN PATENT DOCUMENTS

| EP | 0 034 041 B1 | 8/1981 |
|---|---|---|
| EP | 1 258 545 A1 | 11/2002 |

OTHER PUBLICATIONS

"Chemical Vapor Deposition and Related Processes", Surface Engineering, pp. 1166–1170.

* cited by examiner

Primary Examiner—Timothy Meeks
(74) Attorney, Agent, or Firm—Burns, Doane, Swecker & Mathis, L.L.P.

(57) ABSTRACT

A method for adjusting the size of cooling holes of a gas turbine component is disclosed in which the component is shielded with an easily removable and non-conductive shielding material without shielding the cooling holes themselves. The cooling holes are then coated by a galvanic process and the size of the cooling holes is restored to within manufacturing tolerances. The shielding material is removed and, subsequently, a heat treatment for securing a bonding of the metallic coating is applied.

21 Claims, 3 Drawing Sheets

METHOD OF ADJUSTING THE SIZE OF COOLING HOLES OF A GAS TURBINE COMPONENT

This application claims priority under 35 U.S.C. §§ 119 Appln. No. 00111617.7 filed in Europe on May 31, 2000; the entire content of which is hereby incorporated by reference.

FIELD OF INVENTION

The invention relates to a method of adjusting sizes of cooling holes of a gas turbine component, and more particularly, a method of adjusting sizes of cooling holes in a component having at least one protective coating on an outer surface and/or an inner surface, the component being used in a high temperature environment.

STATE OF THE ART

Components such as gas turbine blades, vanes and other cooled parts often contain cavities that distribute cooling air to a plurality of holes in the wall of the part that lead to the outer surface. Most turbine components are coated for protection from oxidation and/or corrosion with, for example, a MCrAlY coating (base coat) and some are also coated with a thermal barrier coating (TBC) for thermal insulation.

Cooling holes are sometimes manufactured larger than the intended size limit. This could happen with a new component during the production of the holes. The problem is that enlarged cooling holes lead to an increased flow of cooling air and an altered film cooling air distribution, which can cause a changed cooling efficiency of the components at different locations. Thus, the overall efficiency can be affected in an unintended and negative manner as a result of using an excessive amount of cooling air. The enlarged cooling holes can also result in increased degradation of the base component at locations where there is a reduced cooling effect. Therefore, the present invention provides an easy method to restore the size of the cooling holes in new components to the originally intended limits and avoids a high rate of scrapping during production of the new parts, particularly during production start-up when errors occur often.

Furthermore, the same problems as discussed above can occur with components in which the size of cooling holes has been changed during service. This can happen due to oxidation, spallation and degradation of the base material exposed on the cooling hole surfaces. The present invention provides a method to repair these components rather than to use new parts by restoring the size of the cooling holes to a certain limit. Although there are several methods known in the art for repairing the protective coating itself, the known methods avoid the coating of the cooling holes. The known methods, such as disclosed e.g. in U.S. Pat. Nos. 4,743,462 and 5,800,695 do not provide methods for adjusting the size of cooling holes to bring them back to a given tolerance.

SUMMARY OF THE INVENTION

The present invention provides a method of adjusting the size of cooling holes of a gas turbine component to a size within manufacturing tolerances. The method can be applied with cooling holes which are initially manufactured with a greater size than desired, or with cooling holes which have an increased diameter due to oxidation, spallation or other factors, and must be serviced.

In the present invention a method is provided for restoring cooling holes in a component to within a desired tolerance. The component is shielded on at least the inside cavity or cooling passage into which the cooling holes are connected with a coating of wax or plastic or other easily removable and non-conducting material. The component is then subjected to a coating process, such as galvanic coating or a vapor phase coating process, in which a metallic coating is applied to the inside of the cooling holes to a thickness that restores the cooling holes to intended design manufacturing tolerances, after which the shielding material is removed. A heat treatment may be applied to the component to ensure the quality of the bonding of the newly applied metallic coating to the component.

The method according to the present invention has an advantage of bringing the size of the cooling holes to a desired tolerance relatively easily. This applies for both cooling holes manufactured with a size greater than intended originally or for cooling holes which have a greater size due to oxidation or spallation during service. In the last case it might be necessary to remove remaining oxidized material before applying the process by any suitable means such as acid cleaning, grit blasting or fluoride ion cleaning.

Where the component has two protective coatings, a metallic and a ceramic at the outside, the component is shielded during the method according to the invention with the shielding material provided only at the inside. On the other hand, where the component has only one protective coating on the outside, and does not include a ceramic coating, the component is shielded with the shielding material provided at both the inside and the outside.

In one embodiment of the invention, the metallic coating could have the following composition (wt-%): 25% Cr, 5.5% Al, 2.7% Si, 1.0% Ta, 0.45–0.8% Y, max. 0.03% C, balance Ni and unavoidable impurities. Also possible is a metallic coating such as Pt or Ni-based and containing at least one of the following components Cr, Al, Y. When the metallic coating is Pt, the Pt is applied by means of a galvanic process, and this could be followed by an aluminizing process using pack aluminizing, above-the-pack aluminizing or any other means for depositing on top of the already deposited Pt.

In another possible embodiment the metallic coating is applied by means of a high temperature chemical vapor deposition or any other gas phase means, and the portions of the component not desired to be coated are protected with a high temperature resistant masking material.

In a preferred embodiment the base component could have one of the following compositions:

A. max. 400 ppm C, 65 ppm B, (wt.-%) 0.2% Hf, 6.4% Cr, 9.6% Co, 0.6% Mo, 6.4% W, 6.5% Ta, 2.9% Re, 5.6% Al, 1.0% Ti, B. 700 ppm C, 150 ppm B, (wt.-%) 1.4% Hf, 8.0% Cr, 9.0% Co, 0.5% Mo, 10.0% W, 3.2% Ta, 5.6% Al, 0.7% Ti, C. max. 1600 ppm C, 150 ppm B, (wt.-%) 1.4% Hf, 8.4% Cr, 10.0% Co, 0.7% Mo, 10.0% W, 3.0% Ta, 5.5% Al, 1.0% Ti

BRIEF DESCRIPTION OF THE DRAWINGS

The invention is illustrated by the accompanying drawings, in which.

The drawings show only the parts necessary to illustrate the invention. The same elements are numbered the same in different drawings.

DETAILED DESCRIPTION OF THE INVENTION

Figure 1:
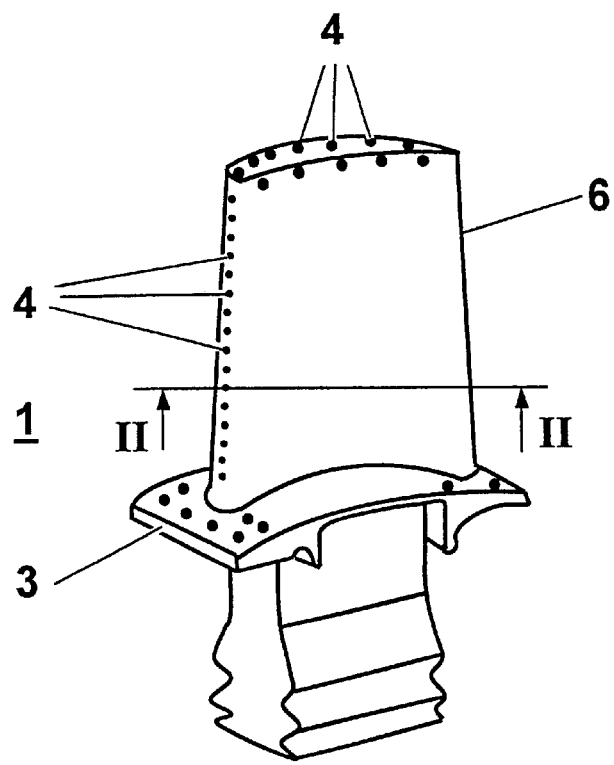
FIG. 1 shows a gas turbine blade with a cooling configuration.

FIG. 1 shows a component 1 such as blades or vanes of gas turbine engines comprising a cavity 2, not visible in FIG. 1, and cooling holes 4, which are on the external surface 6 of the component 1 as well as on the platform 3 of the component 1. The present invention relates to a process of adjusting the size of the cooling holes 4 to a desired tolerance by means of applying a coating within the cooling holes 4.

Figure 2:
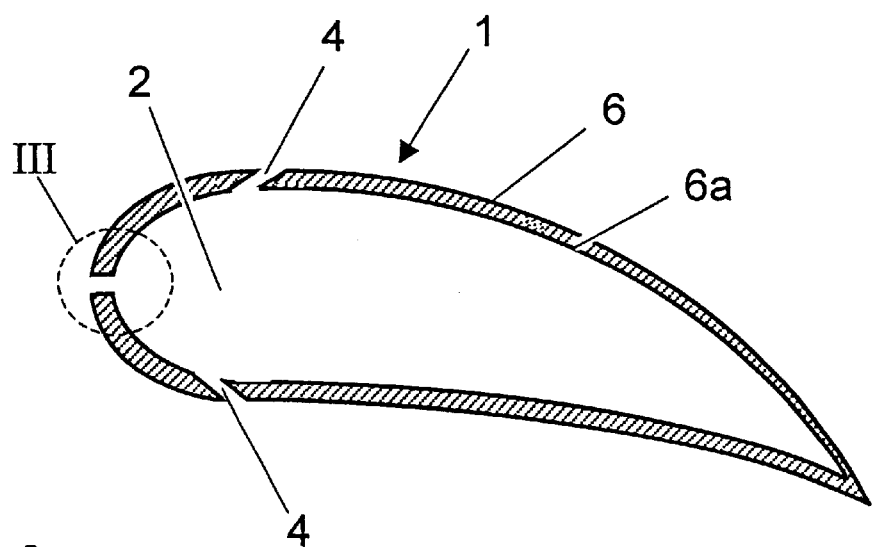
FIG. 2 shows a section through the turbine blade shown in FIG. 1 taken along line II—II, comprising a cavity and a plurality of cooling holes.

FIG. 2 illustrates a section through component 1 taken along line II—II in FIG. 1. The component 1 includes a cavity 2 and three cooling holes 4. The number of the cooling holes 4 is given only as an example and may vary depending on the particular application in which the component 1 is used. The component 1 has an external surface 6 and an internal surface 6a.

It is possible to apply the process according to the invention for adjusting the size of the cooling holes 4 of a new component 1 as well as a component 1 which has to be repaired after use. For a new component 1 the size of the cooling holes 4 might be out of a margin of tolerance immediately after the initial manufacturing process. Deviations from the desired margin of tolerance can occur during the production of the cooling holes 4 by means of laser drilling, a spark erosion process or any similar process. In the case of a used component 1, the size of the cooling holes 4 may have been changed by oxidation or spallation during use of the component. Whether the error in the size of the cooling holes occurs during the initial manufacturing or after use, the effect can be an undesired decrease in cooling efficiency, which can affect the efficiency of the entire gas turbine.

The steps of the process according to the invention are illustrated in FIGS. 3 to 6, which show an illustrative cooling hole 4 from the component 1, such as the cooling hole 4 identified by the circle III in FIG. 2.

Figure 3:
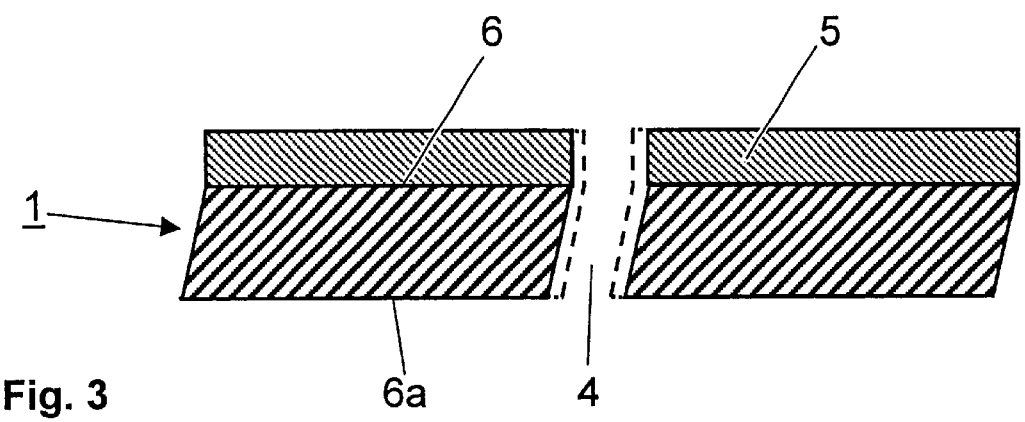
FIGS. 3–6 show the steps of the method according to the invention.

FIG. 3 shows the component 1 at the beginning of the method according to the invention. The external surface 6 is masked with a protective coating 5 such as MCrAlY, which is known in the state of the art. MCrAlY is a family of high temperature coatings, wherein M is selected from one or a combination of iron, nickel and cobalt. As an example, U.S. Pat. Nos. 3,528,861 and 4,585,481 disclose such kinds of oxidation resistant coatings. U.S. Pat. No. 4,152,223 discloses such methods of coating and the coating itself. As seen from FIG. 3, the cooling holes 4 have greater size then the desired size within an allowable margin of tolerance illustrated by the dashed lines.

Figure 4:
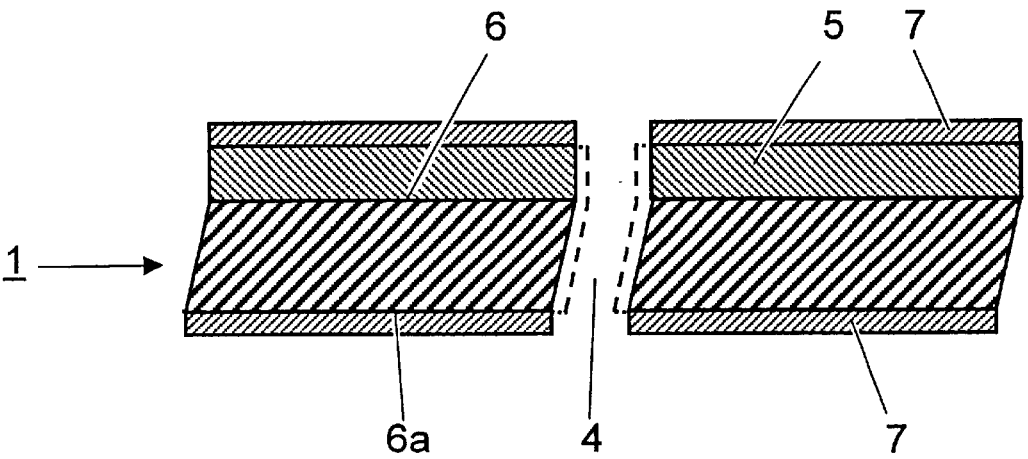
Figure 4A:
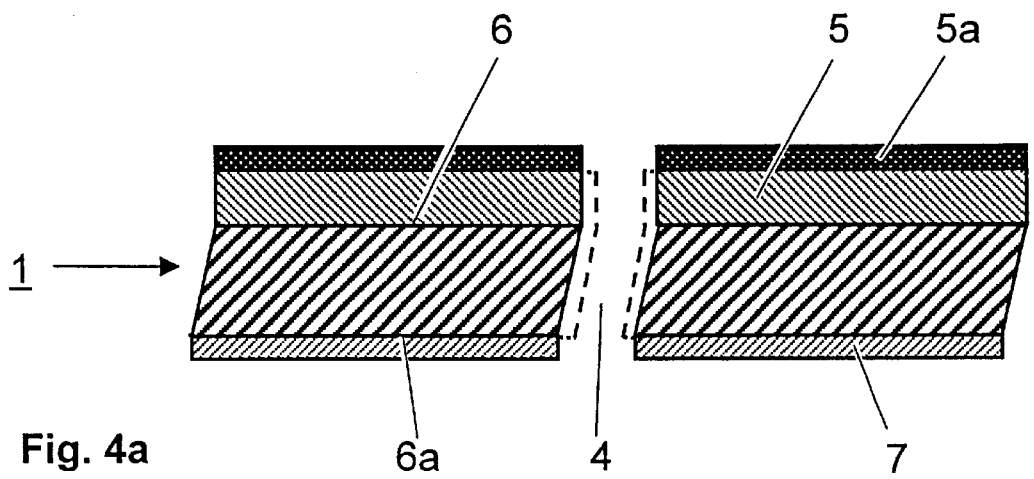

FIGS. 4 and 4a illustrate the first steps of the method according to the present invention. The component 1 is shielded at least on the side of one or both surfaces 6 and 6a. In FIGS. 4 and 4a, the inner surface 6a is provided with a shielding coating 7 of wax or plastic or other easily removable and non conducting material. In the case where there is a ceramic coating 5a provided on the outer surface, the shielding coating 7 only has to be applied at the inner surface 6a, as seen in FIG. 4a. FIG. 4 shows an embodiment wherein both surfaces 6 and 6a are shielded due to a lack of the ceramic coating 5a. As another alternative, no shielding may be necessary, e.g. when there is a ceramic coating on the outside and vapor phase aluminizing is used for the new coating.

In the case where the diameter of the cooling holes 4 has changed due to spallation or oxidation during use of the component 1, before the step of providing a shielding coating 7, there can be a step of cleaning the inside of the cooling holes 4 from remaining oxidized material by any suitable process such as acid cleaning, grit blasting, fluoride ion cleaning, etc.

Figure 5:
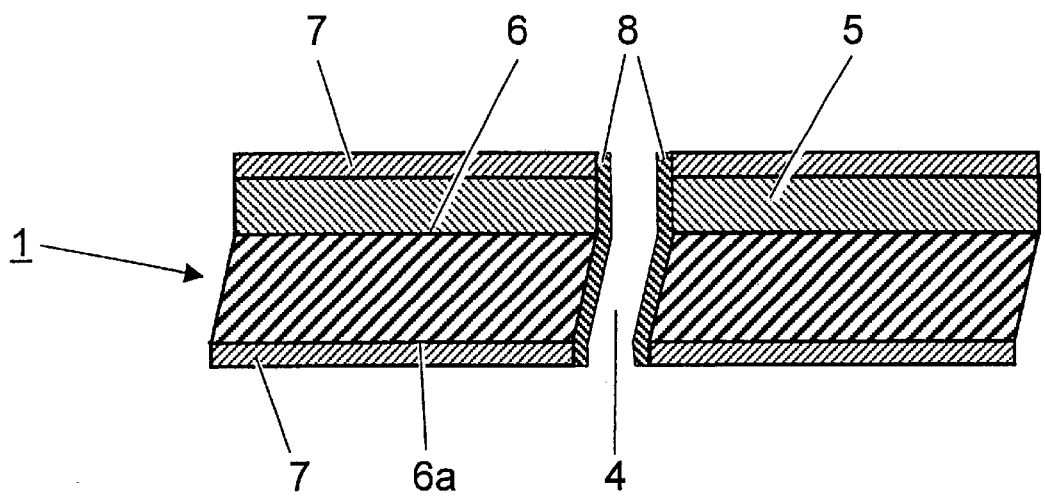

After the cleaning and/or coating with a shielding coating, and as seen in FIG. 5, the component 1 is subjected to a coating process, such as galvanic coating or a vapor phase coating process, in which a metallic coating 8 is applied to the inside of the cooling holes 4 to a thickness that brings back the cooling holes 4 to within manufacturing tolerances. There are different possible materials which could be used for the metallic coating 8.

The metallic coating 8 could have the following composition (wt- %): 25% Cr, 5.5% Al, 2.7% Si, 1.0% Ta, 0.45–0.8% Y, max. 0.03% C, balance Ni and unavoidable impurities. The metallic coating 8 could also be Pt or Ni-based and containing at least one of the following components Cr, Al, Y. When the metallic coating 8 is Pt, the Pt may be applied by means of a galvanic process, and this is followed by an aluminizing process using pack aluminizing, above-the-pack aluminizing or any other means for depositing on top of the already deposited Pt. The method of aluminizing is described in e.g. Metals Handbook, Desk Edition (2. Edition 1998), p.1166–1170, issued by the American Society of Metals (ASM). Possible methods for the deposition, as known in the state of the art, can include chemical or physical vapor deposition (CVD, PVD). Furthermore, the metallic coating 8 could be applied by means of a high temperature chemical vapor deposition or other gas phase means, and the portions of the component that are not desired to be coated could be protected with a high temperature resistant masking material 7. This could be e.g. a paste comprising mainly metal oxides.

Figure 6:
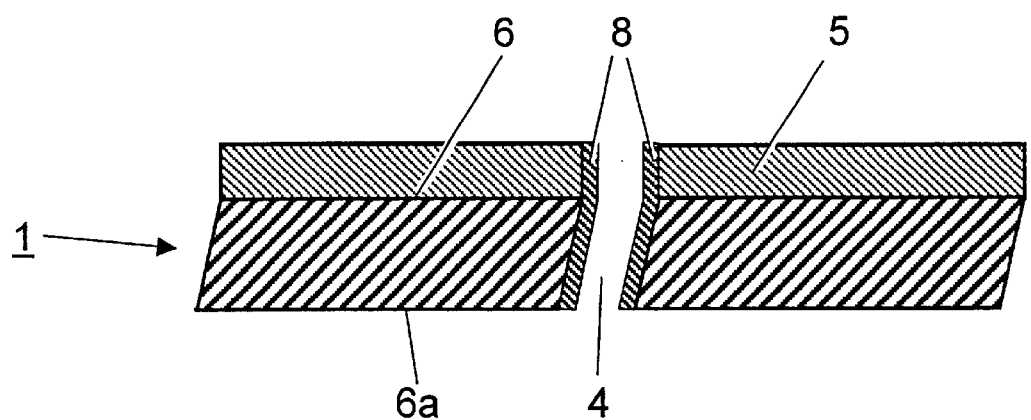

At the last step of the invention the shielding material 7 is removed and the dimensions of the cooling holes 4 are within desired tolerances again. This could be done e.g. by a suitable heat treatment, which melts out the wax or plastic. This is seen in FIG. 6. In addition, a heat treatment is applied to the component 1 to ensure the quality of the bonding of the newly applied metallic coating 8.

The base component 1 could have one of the following compositions:
  A. max. 400 ppm C, 65 ppm B, (wt-%) 0.2% Hf, 6.4% Cr, 9.6% Co, 0.6% Mo, 6.4% W, 6.5% Ta, 2.9% Re, 5.6% Al, 1.0% Ti, balance Ni and unavoidable impurities.
  B. 700 ppm C, 150 ppm B, (wt-%) 1.4% Hf, 8.0% Cr, 9.0% Co, 0.5% Mo, 10.0% W, 3.2% Ta, 5.6% Al, 0.7% Ti, balance Ni and unavoidable impurities or
  C. max. 1600 ppm C, 150 ppm B, (wt-%) 1.4% Hf, 8.4% Cr, 10.0% Co, 0.7%Mo, 10.0% W, 3.0% Ta, 5.5% Al, 1.0% Ti balance Ni and unavoidable impurities.

The invention is not limited to the embodiments described above. Variations and changes may be made from the disclosed embodiments without departing from the invention as set forth in the claims.

What is claimed is:

1. A method of adjusting the size of cooling holes in a component with an outer surface and an inner surface and an internal cavity with a cooling configuration, the component being used in a high temperature environment, and comprising at least one protective coating on at least one of the outer surface and the inner surface, the cooling holes having a greater diameter than desired, wherein the method includes:

subjecting the component to a coating process in which a metallic coating is applied only to the inside of the cooling holes to a thickness that restores the cooling holes to within intended design manufacturing tolerances.

2. The method of claim 1, further including:

applying a heat treatment to the component to ensure the quality of the bonding of the metallic coating applied to the inside of the cooling holes.

3. The method of claim 1, wherein the cooling holes are produced with a diameter greater than desired during the initial manufacturing of the component.

4. The method of claim 1, wherein the cooling holes having a diameter greater than desired have become larger due to one or more of oxidation and spallation occurring during use of the component.

5. The method of claim 4, wherein before applying the method according to claim 4, the cooling holes are cleaned of remaining oxidized material by a process selected from one or more of acid cleaning, grit blasting, and fluoride ion cleaning.

6. The method of claim 1, wherein the component is shielded on at least one of the outer surface and the inner surface with a coating of wax or plastic or other easily removable and non-conducting material before the coating process and the shielding material is removed after finishing the coating process.

7. The method of claim 6, wherein the component has two protective coatings including a metallic coating and a ceramic coating on the outer surface, and the component is shielded with the shielding material only on the inner surface.

8. The method of claim 6, wherein the component has only one protective coating, which is not a ceramic coating, and the component is shielded with the shielding material on both the inner surface and the outer surface.

9. The method of claim 6, wherein the metallic coating is applied by means of a chemical vapor deposition or other gas phase means, and portions of the component that are not desired to be coated are protected with a masking material.

10. The method of claim 6, wherein the metallic coating has a following composition (wt-%): 25% Cr, 5.5% Al, 2.7% Si, 1.0% Ta, 0.45–0.8% Y, max. 0.03% C, balance Ni and unavoidable impurities.

11. The method of claim 6, wherein the metallic coating is Pt or Ni-based and contains at least one of the following components: Cr, Al, Y.

12. The method of claim 11, wherein the metallic coating is Pt and the Pt is applied by means of a galvanic process, and the application of Pt is followed by an aluminizing process using pack aluminizing, above-the-pack aluminizing or any other means for depositing on top of the already deposited Pt.

13. The method of claim 1, wherein the component has the following composition:
   max. 400 ppm C, 65 ppm B, (wt-%) 0.2% Hf, 6.4% Cr, 9.6% Co, 0.6% Mo, 6.4% W, 6.5% Ta, 2.9% Re, 5.6% Al, 1.0% Ti, balance Ni and unavoidable impurities.

14. The method of claim 1, wherein the component has the following composition:
   700 ppm C, 150 ppm B, (wt-%) 1.4% Hf, 8.0% Cr, 9.0% Co, 0.5% Mo, 10.0% W, 3.2% Ta, 5.6% Al, 0.7% Ti balance Ni and unavoidable impurities.

15. The method of claim 1, wherein the component has the following composition:
   max. 1600 ppm C, 150 ppm B, (wt-%) 1.4% Hf, 8.4% Cr, 10.0% Co, 0.7% Mo, 10.0% W, 3.0% Ta, 5.5% Al, 1.0% Ti balance Ni and unavoidable impurities.

16. The method of claim 1, wherein the component is a blade or a vane or a part of a burner chamber within a gas turbine.

17. The method according to claim 1, wherein the coating process is galvanic coating or a vapor phase coating process.

18. A method of adjusting the size of cooling holes in a component with an outer surface and an inner surface and an internal cavity with a cooling configuration, the component being used in a high temperature environment, and comprising at least one protective coating on at least one of the outer surface and the inner surface, the cooling holes having a greater diameter than desired, wherein the method includes:

cleaning the cooling holes of remaining oxidized material by a process selected from one or more of acid cleaning, grit blasting, and fluoride ion cleaning; and subjecting the component to a coating process, such as galvanic coating or a vapor phase coating process, in which a metallic coating is applied only to the inside of the cooling holes to a thickness that restores the cooling holes to within intended design manufacturing tolerances.

19. The method according to claim 18, further including:

applying a heat treatment to the component to ensure the quality of the bonding of the metallic coating applied to the inside of the cooling holes.

20. A method of adjusting the size of cooling holes in a component with an outer surface and an inner surface and an internal cavity with a cooling configuration, the component being used in a high temperature environment, and the cooling holes having a greater diameter than desired, wherein the method includes:

shielding the component on at least one of the outer surface and the inner surface with a coating of wax or plastic or other easily removable and non-conducting shielding material;

cleaning the cooling holes of remaining oxidized material by a process selected from one or more of acid cleaning, grit blasting, and fluoride ion cleaning;

subjecting the component to a coating process, such as galvanic coating or a vapor phase coating process, in which a metallic coating is applied only to the inside of the cooling holes to a thickness that restores the cooling holes to within intended design manufacturing tolerances; and removing the shielding material after finishing the coating process.

21. The method according to claims 20, wherein:

the metallic coating is applied by means of a chemical vapor deposition or other gas phase means, and portions of the component that are not desired to be coated are protected with a masking material.

* * * * *